United States Patent
Belogolovy et al.

(10) Patent No.: US 8,230,296 B2
(45) Date of Patent: Jul. 24, 2012

(54) ITERATIVE DECODING OF CONCATENATED LOW-DENSITY PARITY-CHECK CODES

(75) Inventors: Andrey Belogolovy, Saint-Petersburg (RU); Ovchinnikov Andrel, Saint-Petersburg (RU); Krouk Evguenii, Saint-Petersburg (RU)

(73) Assignee: Intel Corporation, Santa Clara, CA (US)

( * ) Notice: Subject to any disclaimer, the term of this patent is extended or adjusted under 35 U.S.C. 154(b) by 766 days.

(21) Appl. No.: 12/162,655

(22) PCT Filed: Jan. 31, 2006

(86) PCT No.: PCT/RU2006/000032
§ 371 (c)(1),
(2), (4) Date: Jan. 21, 2009

(87) PCT Pub. No.: WO2007/089165
PCT Pub. Date: Aug. 9, 2007

(65) Prior Publication Data
US 2009/0249163 A1    Oct. 1, 2009

(51) Int. Cl.
*H03M 13/00* (2006.01)
(52) U.S. Cl. ........ 714/755; 714/752; 714/758; 714/800; 714/801
(58) Field of Classification Search .................. 714/752, 714/755, 758, 780, 800, 801
See application file for complete search history.

(56) References Cited

U.S. PATENT DOCUMENTS

| | | | |
|---|---|---|---|
| 2003/0043487 A1* | 3/2003 | Morita et al. ................... | 360/25 |
| 2004/0123229 A1 | 6/2004 | Kim et al. | |
| 2005/0149842 A1* | 7/2005 | Kyung et al. ................. | 714/800 |
| 2005/0160351 A1* | 7/2005 | Ko et al. ........................ | 714/801 |
| 2006/0107176 A1* | 5/2006 | Song .............................. | 714/758 |
| 2007/0234184 A1* | 10/2007 | Richardson ................... | 714/780 |

FOREIGN PATENT DOCUMENTS

WO    2007089165 A1    8/2007

OTHER PUBLICATIONS

First Office Action Mailed Oct. 8, 2010, Chinese Patent Application No. 200680052162.3.
Behairy, H., et al, "On the Design, Simulation and Analysis of Parallel Concatenated Gallager Codes", Proc. of 2002 IEEE International Conference on communications, vol. 1 of 5, Apr. 28, 2002, pp. 1850-1854.
Futaki, H., et al, "Low-density parity-check (LDPC) coded MIMO systems with iterative turbo decoding", Proc. Of Vehicular Technology Conference 2003, Oct. 6, 2003, pp. 342-346.
Jin, L., et al, "Low complexity decoding algorithm of parallel concatenated LDPC code", Proc. Of IEEE 6th Circuits and System Symposium, May 31, 2004, pp. 289-291.
Lee, H. S., et al, "Serially Concatenated LDPC and Turbo Code with Global Iteration", Proc. Intern. Conference on Systems Engineering 2005, Aug. 16, 2005, pp. 201-204.

* cited by examiner

*Primary Examiner* — Sam Rizk
(74) *Attorney, Agent, or Firm* — Kacvinsky Daisak, PLLC

(57) ABSTRACT

Techniques to perform iterative decoding of concatenated low-density parity-check codes (LDPC) are described. Iterative decoding of the concatenated code is achieved by performing T common iterations, wherein a common iteration comprises t1 decoding iterations on the inner LDPC code my means of a first decoder (340) followed by t2 decoding iterations on the outer LDPC code my means of a second decoder (350), and wherein the two decoders exchange soft-output information.

20 Claims, 6 Drawing Sheets

ITERATIVE DECODING OF CONCATENATED LOW-DENSITY PARITY-CHECK CODES

BACKGROUND

Modern wireless communication systems may operate according to Institute of Electrical and Electronics Engineers (IEEE) standards such as the 802.11 standards for Wireless Local Area Networks (WLANs) and the 802.16 standards for Wireless Metropolitan Area Networks (WMANs). Worldwide Interoperability for Microwave Access (WiMAX) is a wireless broadband technology based on the IEEE 802.16 standard of which IEEE 802.16-2004 and the 802.16e amendment are Physical (PHY) layer specifications.

Wireless communications systems, for example those operating to the IEEE 802.11 and 802.16 standards, may include error-correcting schemes. One such scheme is forward error correction (FEC). FEC is a method of obtaining error control in data transmission in which the source (e.g., a transmitter) sends redundant data and the destination (e.g., a receiver) recognizes only the portion of the data that contains no apparent errors. Because FEC does not require handshaking between the source and the destination, it can be used for broadcasting of data to many destinations simultaneously from a single source.

DETAILED DESCRIPTION

Techniques to perform iterative decoding of concatenated low-density parity-check (LDPC) codes are described. For example, one embodiment may perform code construction and deconstruction for an error-correcting code. More specifically, an embodiment is method of iterative decoding of concatenated LDPC codes. Iterative and concatenated schemes for error-correcting code construction allow obtaining longer error-correcting codes from shorter error-correcting codes, improving the balance between the error-correcting ability of the code and the increased overhead required by the code. The code constructions of an embodiment are particularly useful for channels for which special error patterns are probable. Further combinations (or concatenations) of codes can form multi-dimensional code constructions that can be adopted to correct complex-structured error patterns common to, for example, wireless channels.

Figure 1:
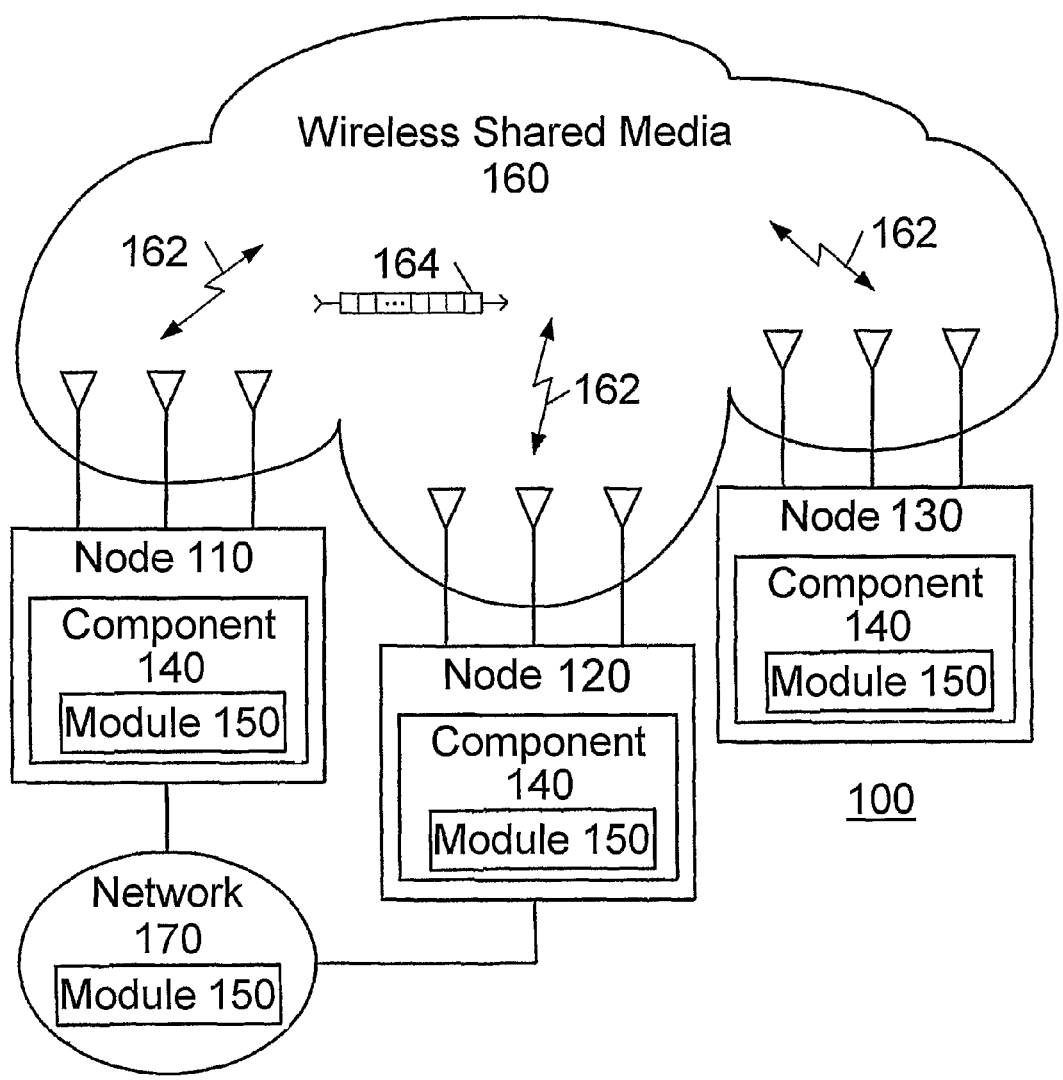
FIG. 1 illustrates one embodiment of a communications system.

FIG. 1 illustrates an embodiment of a system. FIG. 1 illustrates a block diagram of a communications system 100. In various embodiments, communications system 100 may comprise multiple nodes. A node generally may comprise any physical or logical entity for communicating information in communications system 100, and may be implemented as hardware, software, or any combination thereof, as desired for a given set of design parameters or performance constraints. Although FIG. 1 may show a limited number of nodes by way of example, it can be appreciated that more or less nodes may be employed for a given implementation.

In various embodiments, a node may comprise, or be implemented as, a computer system, a computer sub-system, a computer, an appliance, a workstation, a terminal, a server, a personal computer (PC), a laptop, an ultra-laptop, a handheld computer, a personal digital assistant (PDA), a set top box (STB), a television, a digital television, a telephone, a mobile telephone, a cellular telephone, a handset, a wireless access point, a base station (BS), a subscriber station (SS), a mobile subscriber center (MSC), a radio network controller (RNC), a microprocessor, an integrated circuit such as an application specific integrated circuit (ASIC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chip, a transistor, or any other device, machine, tool, equipment, component, or combination thereof. The embodiments are not limited in this context.

In various embodiments, a node may comprise, or be implemented as, software, a software module, an application, a program, a subroutine, an instruction set, computing code, words, values, symbols or combination thereof. A node may be implemented according to a predefined computer language, manner or syntax, for instructing a processor to perform a certain function. Examples of a computer language may include C, C++, Java, BASIC, Perl, Matlab, Pascal, Visual BASIC, assembly language, machine code, microcode for a network processor, and so forth. The embodiments are not limited in this context.

The nodes of communications system 100 may be arranged to communicate one or more types of information, such as media information and control information. Media information generally may refer to any data representing content meant for a user, such as image information, video information, graphical information, audio information, voice information, textual information, numerical information, alphanumeric symbols, character symbols, and so forth. Control information generally may refer to any data representing commands, instructions or control words meant for an automated system. For example, control information may be used to route media information through a system, or instruct a node to process the media information in a certain manner. The media and control information may be communicated from and to a number of different devices or networks.

In various implementations, the nodes of communications system 100 may be arranged to segment a set of media information and control information into a series of packets. A packet generally may comprise a discrete data set having fixed or varying lengths, and may be represented in terms of bits or bytes. It can be appreciated that the described embodiments are applicable to any type of communication content or format, such as packets, cells, frames, fragments, units, and so forth.

Communications system 100 may communicate information in accordance with one or more standards, such as standards promulgated by the IEEE, the Internet Engineering Task Force (IETF), the International Telecommunications Union (ITU), and so forth. In various embodiments, for example, communications system 100 may communicate information according to one or more IEEE 802 standards including IEEE 802.11 standards (e.g., 802.11a, b, g/h, j, n, and variants) for WLANs and/or 802.16 standards (e.g., 802.16-2004, 802.16.2-2004, 802.16e, 802.16f, and variants) for WMANs. Communications system 100 may communicate information according to one or more of the Digital Video Broadcasting Terrestrial (DVB-T) broadcasting standard and the High performance radio Local Area Network (HiperLAN) standard. The embodiments are not limited in this context.

In various embodiments, communications system 100 may employ one or more protocols such as medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), and so forth.

Communications system 100 may include one or more nodes (e.g., nodes 110-130) arranged to communicate information over one or more wired and/or wireless communications media. Examples of wired communications media may include a wire, cable, printed circuit board (PCB), backplane, switch fabric, semiconductor material, twisted-pair wire, coaxial cable, fiber optics, and so forth. An example of a wireless communication media may include portions of a wireless spectrum, such as the radio-frequency (RF) spectrum. In such implementations, the nodes of the system 100 may include components and interfaces suitable for communicating information signals over the designated wireless spectrum, such as one or more transmitters, receivers, transceivers, amplifiers, filters, control logic, antennas and so forth.

The communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a network interface card (NIC), a line card, a disc controller, video controller, audio controller, and so forth.

In various embodiments, communications system 100 may comprise or form part of a network, such as a WiMAX network, a broadband wireless access (BWA) network, a WLAN, a WMAN, a wireless wide area network (WWAN), a wireless personal area network (WPAN), a Code Division Multiple Access (CDMA) network, a Wide-band CDMA (WCDMA) network, a Time Division Synchronous CDMA (TD-SCDMA) network, a Time Division Multiple Access (TDMA) network, an Extended-TDMA (E-TDMA) network, a Global System for Mobile Communications (GSM) network, an Orthogonal Frequency Division Multiplexing (OFDM) network, an Orthogonal Frequency Division Multiple Access (OFDMA) network, a North American Digital Cellular (NADC) network, a Universal Mobile Telephone System (UMTS) network, a third generation (3G) network, a fourth generation (4G) network, a local area network (LAN), a wide area network (WAN), a metropolitan area network (MAN), the Internet, the World Wide Web, a cellular network, a radio network, a satellite network, and/or any other communications network configured to carry data. The embodiments are not limited in this context.

Communications system 100 may employ various modulation techniques including, for example: OFDM modulation, Quadrature Amplitude Modulation (QAM), N-state QAM (N-QAM) such as 16-QAM (four bits per symbol), 32-QAM (five bits per symbol), 64-QAM (six bits per symbol), 128-QAM (seven bits per symbol), and 256-QAM (eight bits per symbol), Differential QAM (DQAM), Binary Phase Shift Keying (BPSK) modulation, Quadrature Phase Shift Keying (QPSK) modulation, Offset QPSK (OQPSK) modulation, Differential QPSK (DQPSK), Frequency Shift Keying (FSK) modulation, Minimum Shift Keying (MSK) modulation, Gaussian MSK (GMSK) modulation, and so forth. The embodiments are not limited in this context.

In various embodiments, communications system 100 may be arranged to decode an error-correction code. More specifically, communications system 100 may be arranged to iteratively decode a concatenated LDPC code. In an embodiment for which there is a 2-dimensional concatenation, communications system 100 is arranged to iteratively decode, at an inner decoder, the LDPC code to produce a soft output for an outer decoder. The outer decoder then iteratively decodes the soft output from the inner decoder. Thereafter, the communication system is arranged to repeat the common iteration (e.g., inner decoder iteration(s) followed by the outer decoder iteration(s)) to accomplish the decoding of the concatenated LDPC code.

In one embodiment, communications system 100 may include one or more wireless communication devices, such as nodes 110-130. Nodes 110-130 all may be arranged to communicate information signals using one or more wireless transmitters/receivers ("transceivers") or radios, which may involve the use of radio frequency communication via 802.16 schemes (e.g., 802.16-2004, 802.16.2-2004, 802.16e, 802.16f, and variants) for WMANs, for example. Nodes 110-130 may communicate using the radios over wireless shared media 160 via multiple inks or channels established therein. Although FIG. 1 is shown with a limited number of nodes in a certain topology, it may be appreciated that communications system 100 may include additional or fewer nodes in any type of topology as desired for a given implementation. The embodiments are not limited in this context.

Further, nodes 110 and 120 may comprise fixed devices having wireless capabilities. A fixed device may comprise a generalized equipment set providing connectivity, management, and control of another device, such as mobile devices. Examples for nodes 110 and 120 may include a wireless access point (AP), base station or node B, router, switch, hub, gateway, media gateway, and so forth. In an embodiment, nodes 110 and 120 may also provide access to a network 170 via wired communications media. Network 170 may comprise, for example, a packet network such as the Internet, a corporate or enterprise network, a voice network such as the Public Switched Telephone Network (PSTN), among other WANs, for example. The embodiments are not limited in this context.

In one embodiment, system 100 may include node 130. Node 130 may comprise, for example, a mobile device or a fixed device having wireless capabilities. A mobile device may comprise a generalized equipment set providing connectivity to other wireless devices, such as other mobile devices or fixed devices. Examples for node 130 may include a computer, server, workstation, notebook computer, handheld computer, telephone, cellular telephone, personal digital assistant (PDA), combination cellular telephone and PDA, and so forth.

Nodes 110-130 may have one or more wireless transceivers and wireless antennas. In one embodiment, for example, nodes 110-130 may each have multiple transceivers and multiple antennas to communicate information signals over wireless shared media 160. For example, a channel 162, link, or connection may be formed using one or more frequency bands of wireless shared medium 160 for transmitting and receiving packets 164. The embodiments are not limited in this context.

Figure 2:
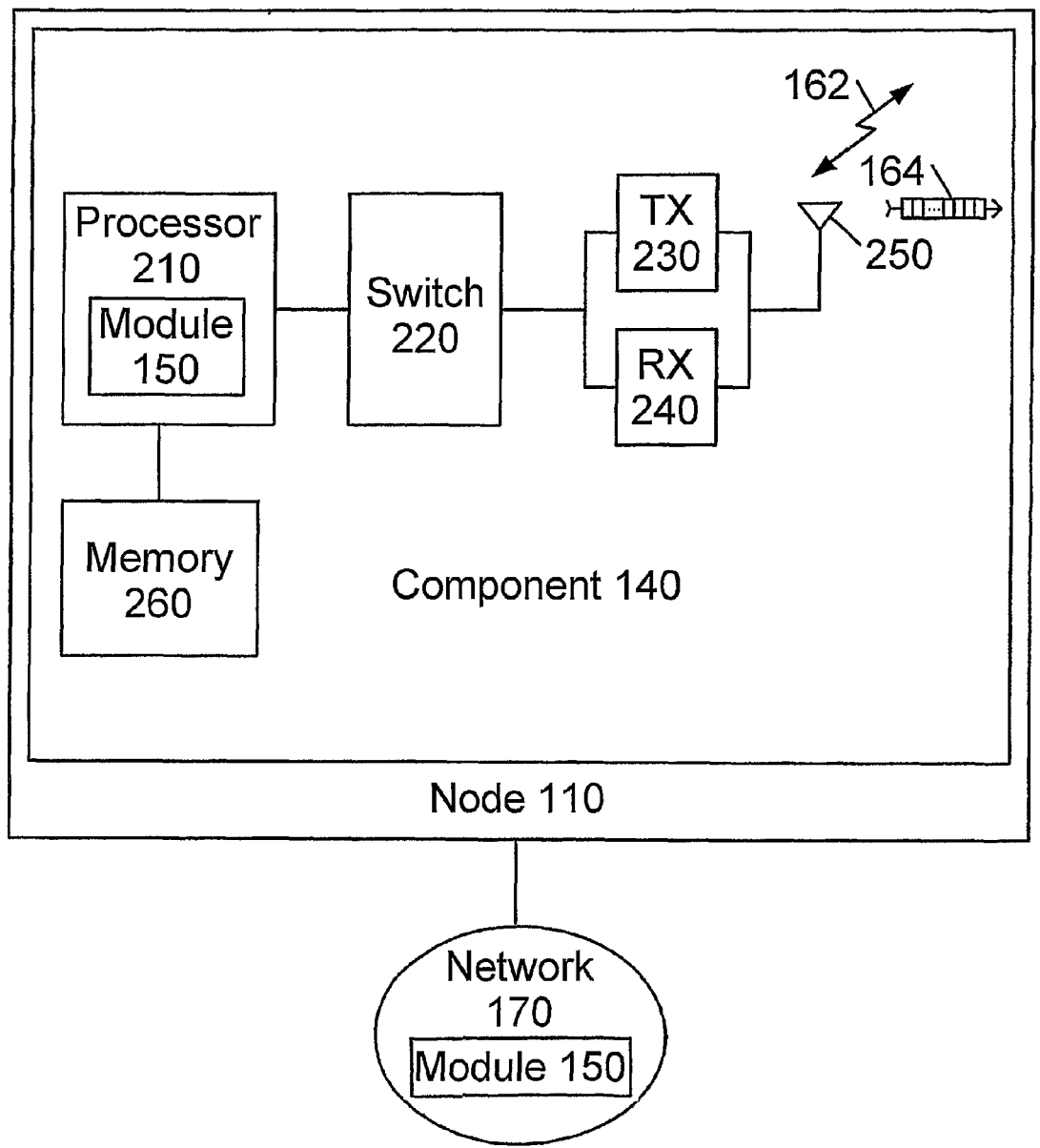
FIG. 2 illustrates one embodiment of a node.

FIG. 2 more specifically illustrates node 110 of communications system 100. As shown in FIG. 2, the node may comprise multiple elements such as component 140, module 150, processor 210, memory 260, switch 220, transmitter 230, receiver 240, and antenna 250 to communicate packets 164 over wireless shared media 160. Transmitter 230 and receiver 240 may also be collectively referred to as a transceiver. Antenna 250 may include an internal antenna, an omni-directional antenna, a monopole antenna, a dipole antenna, an end fed antenna or a circularly polarized antenna, a micro-strip antenna, a diversity antenna, a dual antenna, an antenna array, and so forth. Some elements may be implemented using, for example, one or more circuits, components, registers, processors, software subroutines, or any combination thereof. Although FIG. 2 shows a limited number of elements, it can be appreciated that additional or fewer elements may be used in node 110 as desired for a given implementation. The embodiments are not limited in this context.

As noted, in an embodiment, node 110 may include a processor 210. Processor 210 may be connected to switch 220 and/or the transceiver (e.g., transmitter 230 and receiver 240). Processor 210 may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. In an embodiment, for example, processor 210 may be implemented as a general purpose processor, such as a processor made by Intel® Corporation, Santa Clara, Calif. Processor 210 may also be implemented as a dedicated processor, such as a controller, microcontroller, embedded processor, a digital signal processor (DSP), a network processor, a media processor, an input/output (I/O) processor, a media access control (MAC) processor, a radio baseband processor, a field programmable gate array (FPGA), a programmable logic device (PLD), and so forth. The embodiments are not limited in this context.

In one embodiment, processor 210 may include, or have access to, memory 260. Memory 260 may comprise any machine-readable media. Memory 260 may be implemented using any machine-readable or computer-readable media capable of storing data, including both volatile and non-volatile memory. For example, memory 260 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of memory 260 may be included on the same integrated circuit as processor 210, or alternatively some portion or all of memory 260 may be disposed on an integrated circuit or other medium, for example a hard disk drive, that is external to the integrated circuit of processor 210. The embodiments are not limited in this context.

When implemented in a node of communications system 100, node 110 may be arranged to communicate information over wireless communications media between the various nodes, such as nodes 120 and 130. The information may be communicated using in the form of packets 164 over wireless shared media 160, with each packet 164 comprising media information and/or control information. The media and/or control information may be represented using, for example, multiple Orthogonal Frequency Division Multiplexing (OFDM) symbols. A packet 164 in this context may refer to any discrete set of information, including a unit, frame, cell, segment, fragment, and so forth. The packet may be of any size suitable for a given implementation. The embodiments are not limited in this context.

Figure 3:
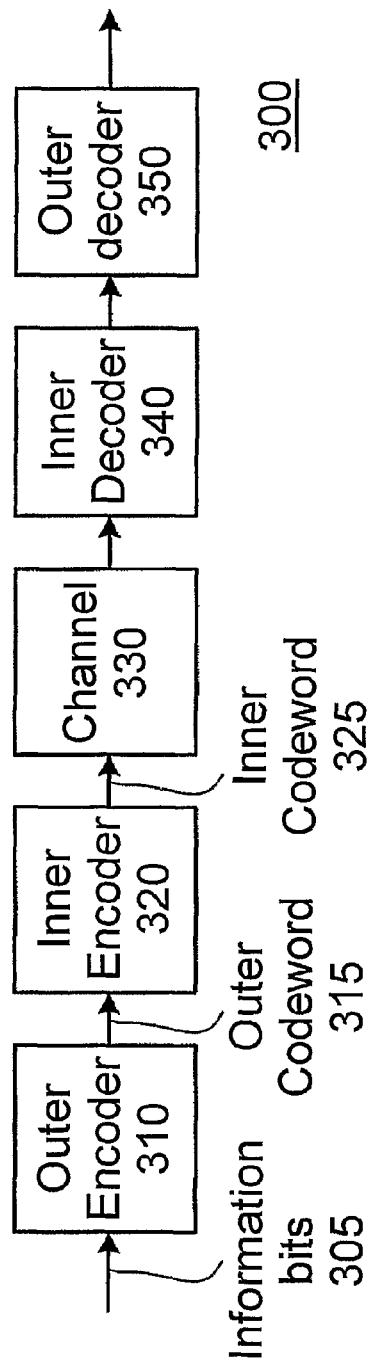
FIG. 3 illustrates one embodiment of a two level code concatenation.

FIGS. 3-7 more specifically describe, for example, the code construction and decoding method of communications system 100 and/or node 110. For example, FIG. 3 illustrates a two-level code concatenation block diagram 300. Information bits 305 are encoded by an outer decoder to generate an outer codeword 315. The outer codeword 315 is thereafter encoded by an inner encoder 320 to generate an inner codeword 325. The inner codeword can then be transmitted over a channel 330 (e.g., channel 162 of communications system 100). In an embodiment, channel 330 is a channel according to the IEEE 802.11 or 802.16 standards. At the encoding end, concatenated codes offer significant error-correcting abilities while simultaneously not excessively burdening the encoded signal with redundant overhead.

The inner code word 325 is then received and first decoded by the inner decoder 340. Thereafter, the soft output of the inner decoder 340 is further decoded by the outer decoder 350. Generally speaking, at the decoding side, code concatenation may efficiently reduce the number of errors occurred in communication channel (e.g., the bit error rate, or BER). For example, the soft output of the inner decoder 340 has already been error-corrected by the inner decoder 340. Accordingly, the input to the outer decoder 350 may include fewer errors and may allow the outer decoder 350 to operate more efficiently.

One combination for the two-level concatenation 300 scheme Reed-Solomon code as the outer code and convolutional code as the inner code. Such a combination may be effective in reducing the BER for a given signal to noise ratio (SNR) for a signal. In an embodiment, both the outer and inner codes are LDPC codes. LPDC codes are a class of linear block codes that provide near-capacity performance (e.g., approaching the Shannon limit, or the theoretical maximum amount of error-free digital data that can be transmitted over a communications link with a specified bandwidth in the presence of noise interference) for a large variety of data transmission and storage channels while further permitting decoders that are practical to implement. For example, versus the combination of Reed-Solomon and convolutional codes noted above, concatenated LDPC codes may offer the same or improved error correction while simultaneously decreasing the complexity required by the decoders.

Figure 4:
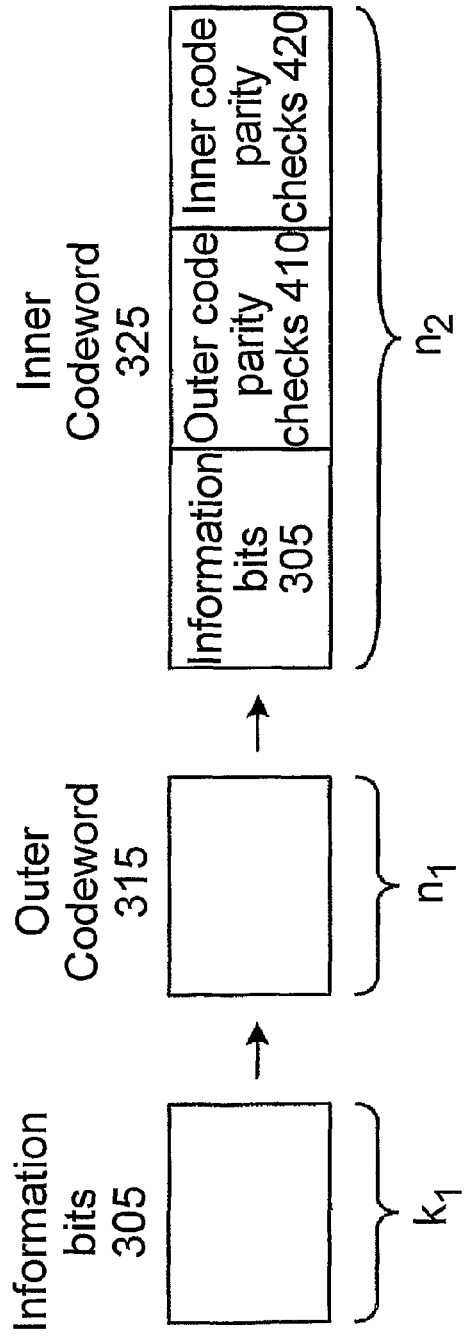
FIG. 4 illustrates one embodiment of encoding a two level code concatenation.

FIG. 4. illustrates encoding the two level code concatenation 400 of FIG. 3 of an embodiment. More specifically, FIG. 4. illustrates a two level code concatenation 400 including an $(n_1, k_1)$ outer LDPC code and an $(n_2, k_2)$ inner LDPC code for which $k_2 = n_1$. For example, information bits 305 of bit length $k_1$ are encoded by the outer encoder 310 to generate an outer codeword 315 of bit length $n_1$. In an embodiment, the outer encoder uses LDPC coding to encode the information bits 305. Thereafter, the outer codeword is encoded by the inner encoder 320 to generate an inner codeword 325 of bit length $n_2$. In an embodiment, the inner encoder uses LDPC coding to encode the outer codeword 315. Inner codeword 325 includes the information bits 305, outer code parity checks 410, and inner code parity checks 420. Outer code parity checks 410 and inner code parity checks 420 are generated in an embodiment by the outer encoder 310 an inner encoder 320 respectively, each utilizing LDPC coding. In an embodiment, the codes have a systematic form (e.g. the first bits in sequence are information bits 305). Such a systematic form correlates, for example, to codes proposed by the 802.16 standards. The inner codeword 325 can thereafter be transmitted over a communications channel (e.g., a communications channel according to the 802.11 or 802.16 standards). In a further embodiment, the two level code concatenation 400 may include codes that do not have a systematic form. In a non-systematic form, the information bits 305 (symbols) may be arranged along the codeword (e.g., outer codeword 315 and/or inner codeword 325), and may not be the first bits in the codeword sequence.

Figure 5:
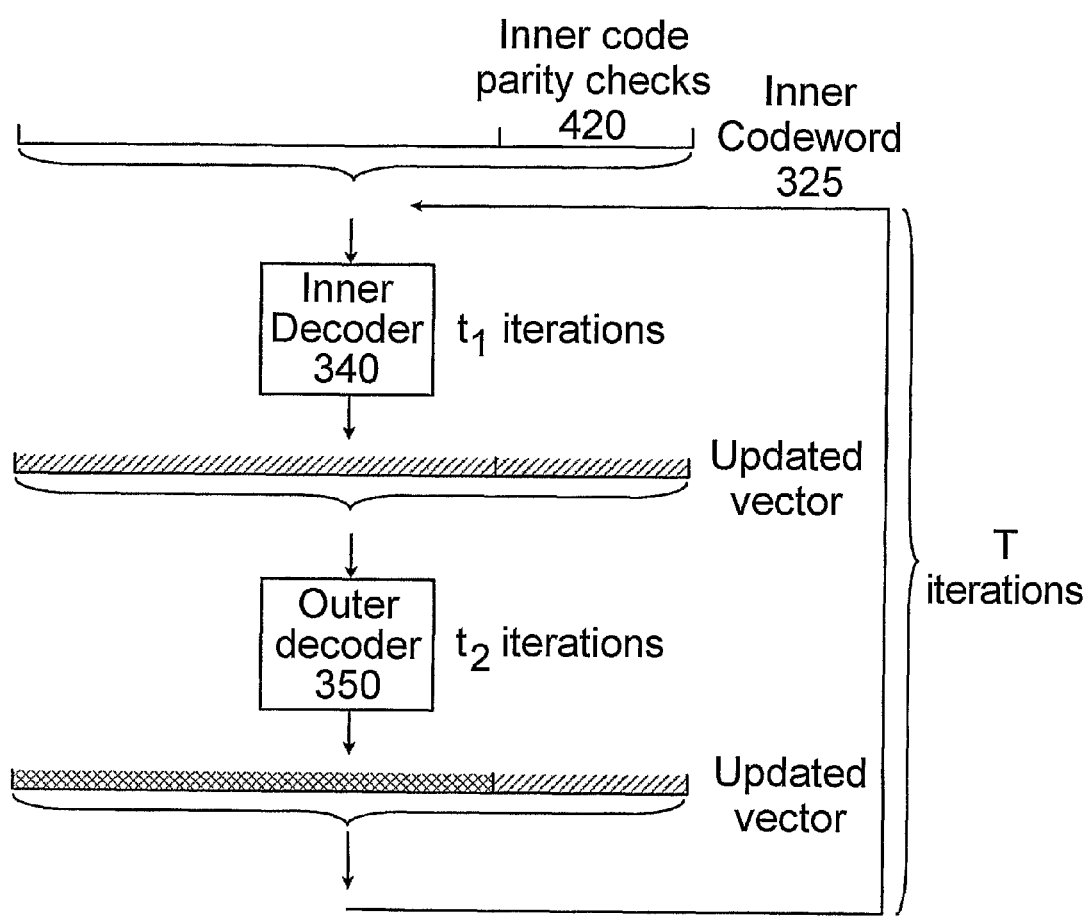
FIG. 5 illustrates one embodiment of iterative decoding.

FIG. 5. illustrates the iterative decoding of an embodiment. In general, at a receiver, decoding the inner codeword 325 of an embodiment occurs in the reverse order as the encoding. First, for example, the $n_2$ bits of inner codeword 325 are decoded by the inner decoder 340 to recover the $n_1$ bits of outer codeword 315. The $n_1$ bits of outer codeword 315 are then decoded by the outer decoder 300 to recover $k_1$ information bits. Further, the decoding process may occur in iterative steps. In an embodiment, and as will be explained more fully below, the maximum sum of iterations by both decoders (e.g., inner decoder 340 and outer decoder 350) is t. In an embodiment, t may be selected to balance the trade-off between decoding performance (e.g., error probability) and latency.

In an embodiment, each decoder (e.g., inner decoder 340 an outer decoder 350) decodes LDPC codes. Decoders of LDPC codes are soft-input/soft output (SISO) decoders that process iteratively to make per-symbol decisions. Soft input refers to the property that the decoder considers not only received bits, but also additional information about probabilities associated with the bits. An LDPC decoder is further capable of outputting reliable soft-decision information about the symbols (e.g., soft output) after any iteration to, for example, another LDPC decoder.

More specifically, an embodiment is an iterative decoding method for which the decoding iterations are made jointly (e.g., not wholly sequentially) by, for example, inner decoder 340 and outer decoder 350 to recover information bits 305. First, the inner decoder 340, having received inner codeword 325, performs $t_1$ iterations, for which $t_1 < t$, to generate a soft output. Then the outer decoder 350 receives as an input $k_2$ soft message bits generated by the inner decoder 340. The outer decoder 350 then processes $t_2$ iterations, updating the $n_1 = k_2$ soft values. Thereafter, the outer decoder 350 processes both the updated $k_2$ soft values and $r_2$ values remaining from the first decoding iteration for which $r_2 = n_2 - k_2$. In an embodiment, one cycle of the inner decoder 340 iteration(s) and outer decoder 350 iteration(s) may be referred to as a common iteration. Accordingly, each common iteration includes $t_1$ inner decoder 340 iterations and $t_2$ outer decoder 350 iterations, or $t_1 + t_2$ total iterations. The common iteration of an embodiment may itself be repeated T times. In an embodiment, The number T of common iterations can be selected to provide $T(t_1 + t_2) = t$. Such a selection for T provides substantially the same decoding complexity as a conventional sequential decoder for which the inner codeword 325 is decoded by inner decoder 340 before being passed to outer decoder 350. In an embodiment, T, $t_1$, $t_2$, and t may all be selected to balance the trade-off between decoding performance (e.g., error probability) and latency. For example, more iterations (or different combinations of common and individual decoder iterations) may decrease the error probability while increasing the latency. Different communications applications may be sensitive to errors, latency, or a combination thereof. In an embodiment, T=20 and $t_1 = t_2 = 1$.

In an embodiment, the performance of an LDPC decoder (e.g., inner decoder 340 and outer decoder 350) is substantially dependent on the existence of cycles in the parity-check matrix of the LDPC code. For example, a larger cycle length decreases the probability that bit errors would affect the parity-check matrix positions that form the cycle. Further, if error positions within the LDPC code affect the cycles in the parity-check matrix, then the decoding iterations of one code (e.g., iterations by a single LDPC decoder) may not correct such an error and the error may thereby loop. Accordingly, after an iteration or iterations of one decoder (e.g., inner decoder 340), the soft output may be transferred to another decoder (e.g., outer decoder 350) that includes a different structure of the parity-check matrix (e.g., different parity-check matrix positions that form the cycle) for an iteration or iterations. The use of multiple decoders for multiple LDPC codes may mitigate the effect of such looped errors. The soft output from the second decoder (e.g., outer decoder 350) may then be returning to initial decoder (e.g., inner decoder 340) for a further iteration or iterations.

Figure 6:
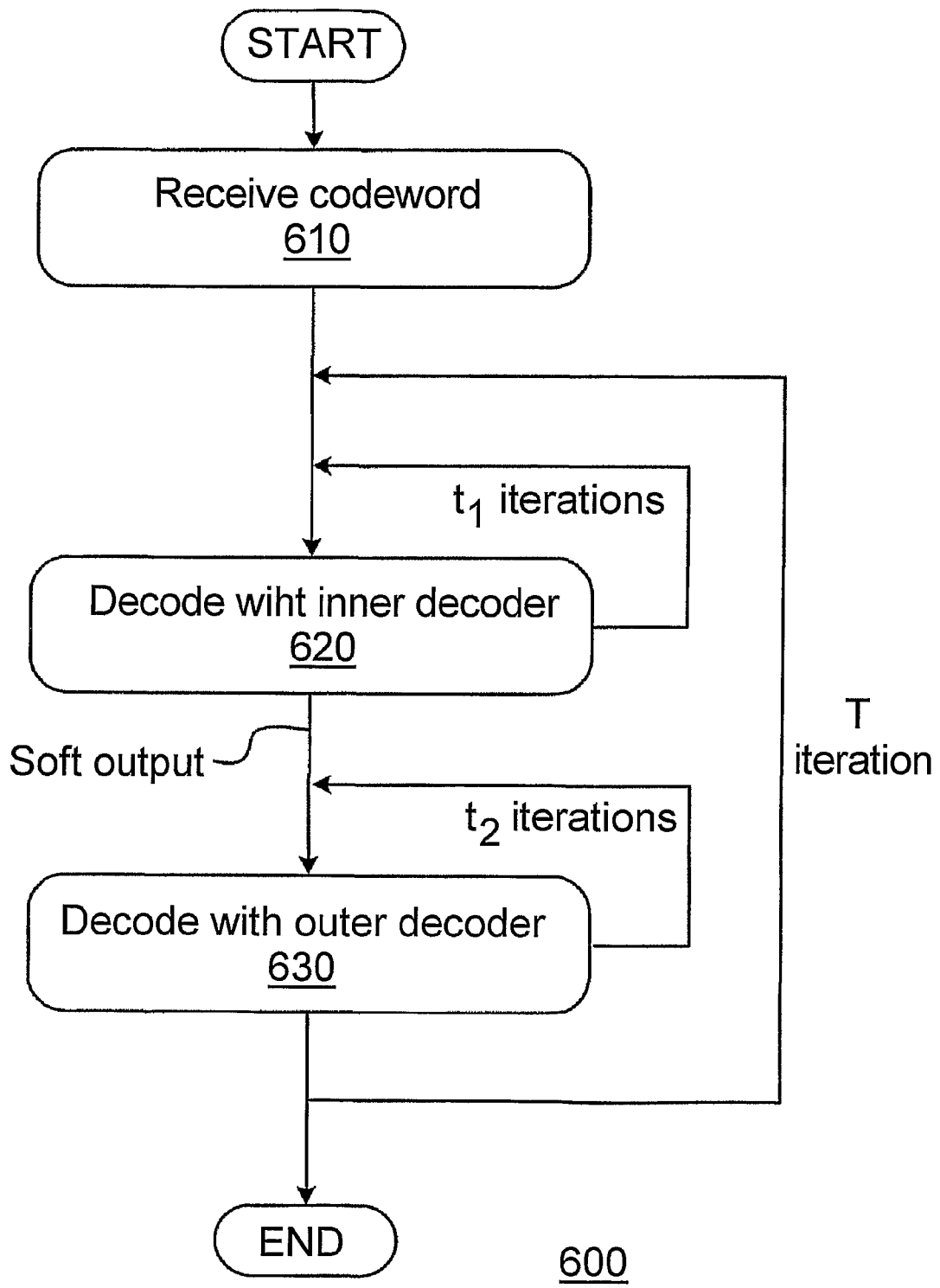
FIG. 6 illustrates one embodiment of a logic flow.

FIG. 6 illustrates a logic flow 600 of an embodiment. At 610, a codeword is received. In an embodiment, the codeword is encoded in a two level code concatenation including an ($n_1$, $k_1$) outer LDPC code and an ($n_2$, $k_2$) inner LDPC code for which $k_2 = n_1$. At 620, an inner decoder iteratively decodes the codeword for $t_1$, iterations. Thereafter, at 630, an outer decoder iteratively decodes the soft output of the inner decoder for $t_2$ iterations. In an embodiment, one cycle of inner decoder iteration(s) 620 and outer decoder iteration(s) 630 may be referred to as a common iteration. Accordingly, each common iteration includes $t_1$ inner decoder iteration(s) 620 and $t_2$ outer decoder iteration(s), or $t_1 + t_2$ total iterations. The common iteration of an embodiment may itself be repeated T times. The number T of common iterations can be selected to provide $T(t_1 + t_2) = t$ as noted above. In an embodiment, T, $t_1$, $t_2$, and t may all be selected to balance the trade-off between decoding performance (e.g., error probability) and latency to optimize an embodiment for a particular communications system 100.

Figure 7:
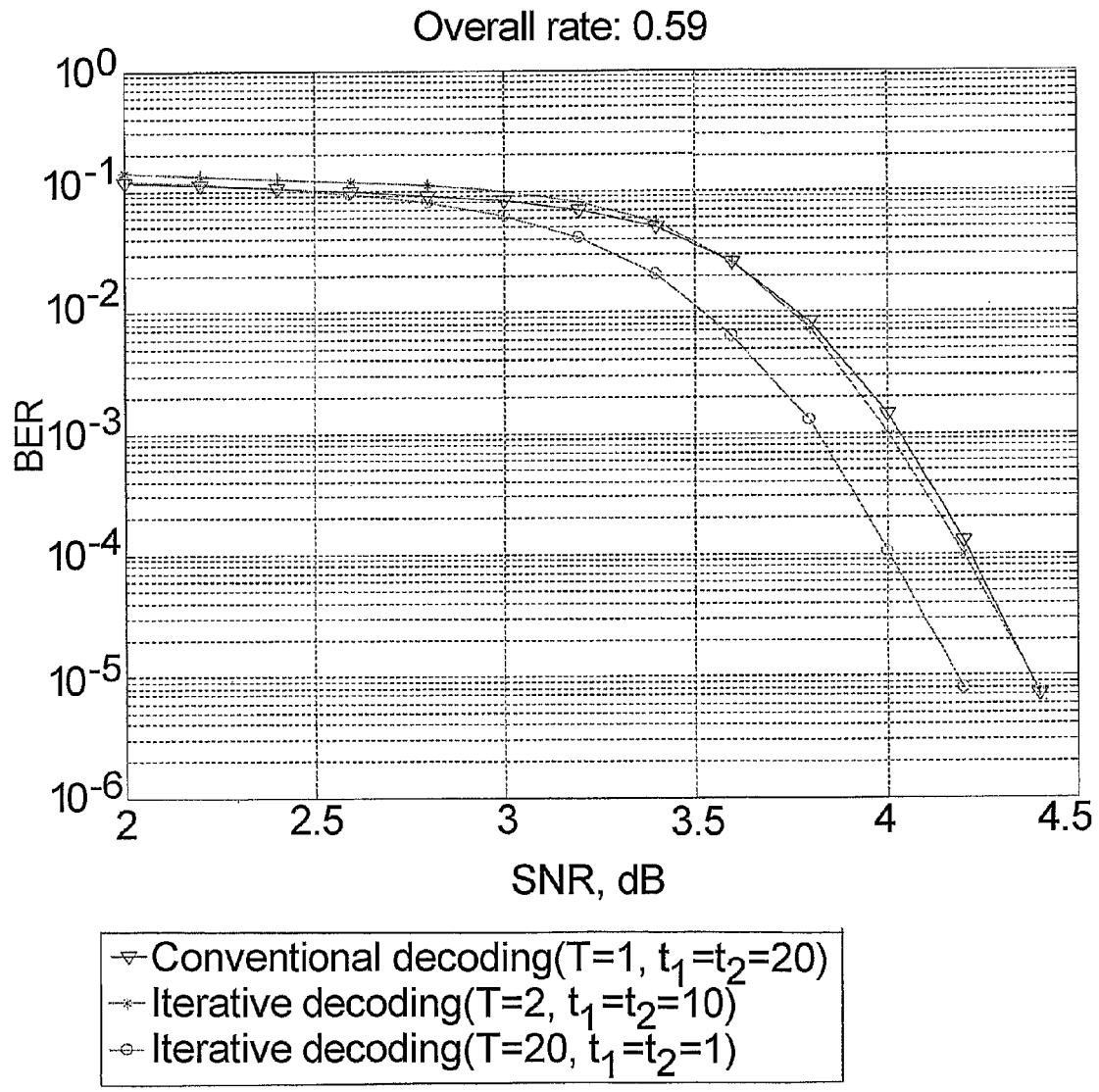
FIG. 7 illustrates one embodiment of simulation results.
Figure 6:
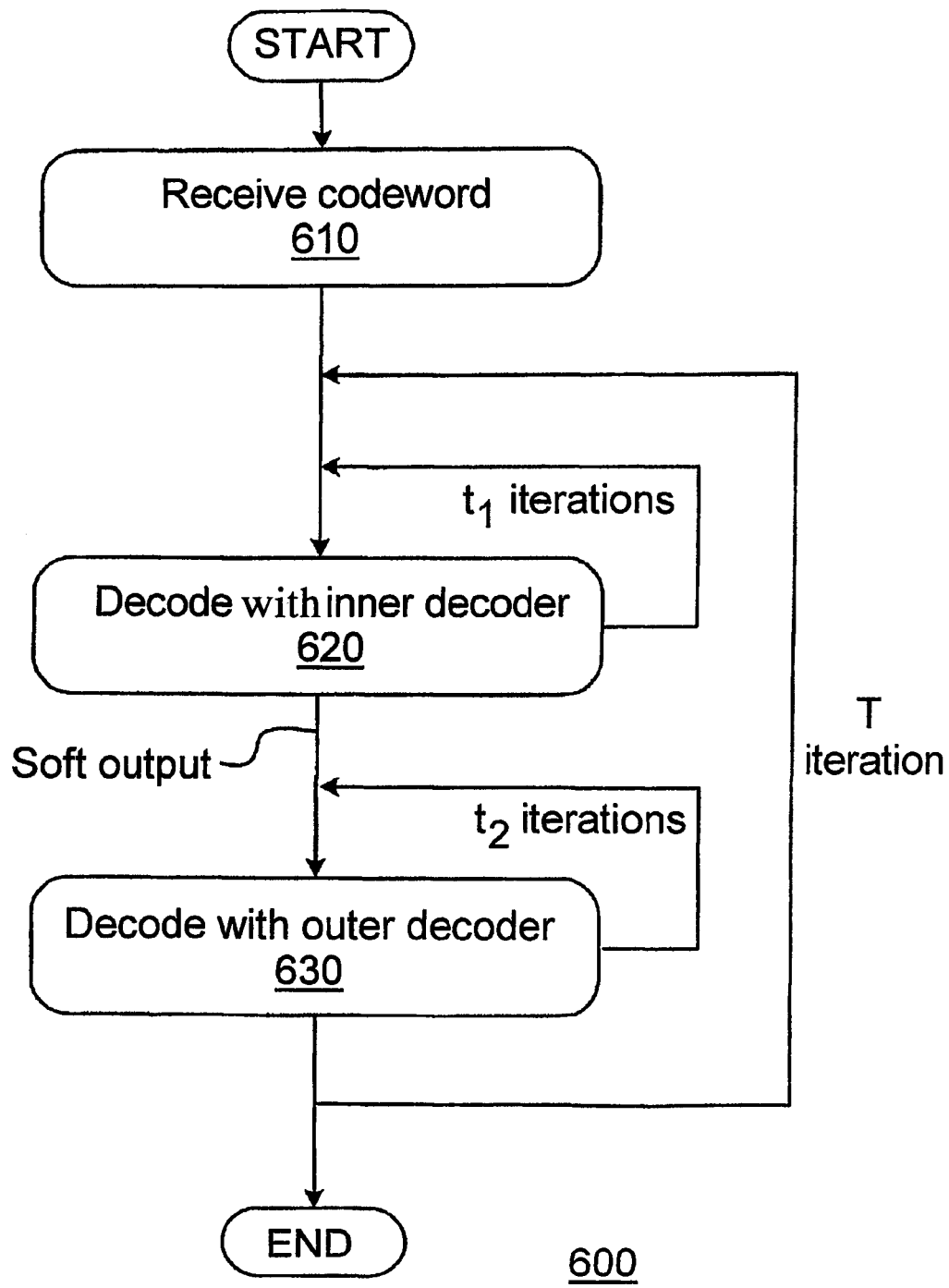

FIG. 7 illustrates simulation results of an embodiment for a (1728, 1354, 0.78) outer code and a (2304, 1728, 0.75) inner code for various combinations of $t_1$, $t_2$, and T. In an embodiment, the simulation results represent an additive white Gaussian noise (AWGN) channel and min-sum decoders for both the inner and outer LDPC decoders. As illustrated, conventional encoding involves 20 iterations by the inner decoder followed by 20 iterations by the outer decoder (e.g., there is only one common iteration). An embodiment, for which T=2, and $t_1 = t_2 = 10$ demonstrates slight improvement in BER for a given SNR. A further embodiment, for which T=20, and $t_1 = t_2 = 1$ (e.g., 20 common iterations for which the inner decoder performs only 1 iteration before sending its soft output to the outer decoder for one iteration), there is approximately a 0.2 dB gain in error probability. In general, the results indicate that for a given maximum number of total iterations, improved BER for a given SNR may be achieved by utilizing more common iterations, and fewer individual decoder iterations.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware. In yet another example, an embodiment may be implemented by any combination of programmed general-purpose computer components and custom hardware components. The embodiments are not limited in this context.

Various embodiments may be implemented using one or more hardware elements. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. The embodiments are not limited in this context.

Various embodiments may be implemented using one or more software elements. In general, a software element may refer to any software structures arranged to perform certain operations. In one embodiment, for example, the software elements may include program instructions and/or data adapted for execution by a hardware element, such as a processor. Program instructions may include an organized list of commands comprising words, values or symbols arranged in a predetermined syntax, that when executed, may cause a processor to perform a corresponding set of operations. The software may be written or coded using a programming language. Examples of programming languages may include C, C++, BASIC, Perl, Matlab, Pascal, Visual BASIC, JAVA, ActiveX, assembly language, machine code, and so forth. The software may be stored using any type of computer-readable media or machine-readable media. Furthermore, the software may be stored on the media as source code or object code. The software may also be stored on the media as compressed and/or encrypted data. Examples of software may include any software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

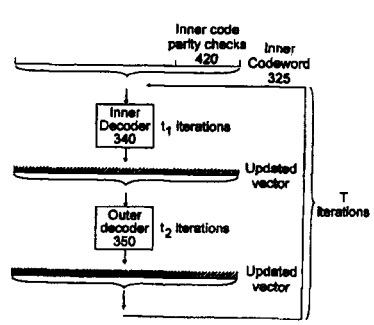

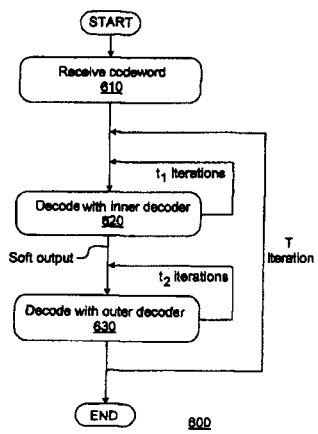

The invention claimed is:

1. An apparatus comprising a node having a first decoder to decode a codeword and a second decoder to decode a soft output received directly from the first decoder, the node to iterate decoding jointly by the first decoder and the second decoder as a number of common iterations, each common iteration comprising a number of first decoder iterations and a number of second decoder iterations.

2. The apparatus of claim 1, the codeword to comprise a concatenated low-density parity-check (LDPC) codeword.

3. The apparatus of claim 1, the node to farther iteratively decode, with the first decoder, the codeword.

4. The apparatus of claim 1, the node to further iteratively decode, with the second decoder, the soft output of the first decoder.

5. The apparatus of claim 1, the number of common iterations greater than the number of first decoder iterations, and greater than the number of second decoder iterations.

6. A system, comprising:
   a communications medium; and
   a node to couple to the communications medium, the node having a first decoder to decode a codeword and a second decoder to decode a soft output received directly from the first decoder, the node to iterate decoding jointly by the first decoder and the second decoder as a number of common iterations, each common iteration comprising a number of first decoder iterations and a number of second decoder iterations.

7. The system of claim 6, the codeword to comprise a concatenated low-density parity-check (LDPC) codeword.

8. The system of claim 6, the node to further iteratively decode, with the first decoder, the codeword.

9. The system of claim 6, the node to further iteratively decode, with the second decoder, the soft output of the first decoder.

10. The system of claim 6, the number of common iterations greater than the number of first decoder iterations, and greater than the number of second decoder iterations.

11. A computer-implemented method comprising:
    performing a first decoding for a codeword using a first decoder;
    performing, using a second decoder, a second decoding for a soft output received directly from the first decoder; and
    iterating the first decoding and the second decoding jointly as a number of common iterations, each common iteration comprising a number of first decoder iterations and a number of second decoder iterations.

12. The computer-implemented method of claim 11, the codeword to comprise a concatenated low-density parity-check (LDPC) codeword.

13. The computer-implemented method of claim 11, comprising iteratively decoding the codeword.

14. The computer-implemented method of claim 11, comprising iteratively decoding the soft output of the first decoder.

15. The computer-implemented method of claim 11, the number of common iterations greater than the number of first decoder iterations, and greater than the number of second decoder iterations.

16. An article comprising a machine-readable storage medium containing instructions that if executed enable a system to perform a first decoding for a codeword using a first decoder, perform, using a second decoder, a second decoding for a soft output received directly from the first decoder, and iterate the first decoding and the second decoding jointly as a number of common iterations, each common iteration comprising a number of first decoder iterations and a number of second decoder iterations.

17. The article of claim 16, the codeword to comprise a concatenated low-density parity-check (LDPC) codeword.

18. The article of claim 16, further comprising instructions that if executed enable the system to iteratively decode the codeword.

19. The article of claim 16, further comprising instructions that if executed enable the system to iteratively decode the soft output of the first decoder.

20. The article of claim 16, the number of common iterations greater than the number of first decoder iterations, and greater than the number of second decoder iterations.

* * * * *

UNITED STATES PATENT AND TRADEMARK OFFICE
CERTIFICATE OF CORRECTION

PATENT NO. : 8,230,296 B2
APPLICATION NO. : 12/162655
DATED : July 24, 2012
INVENTOR(S) : Andrey Belogolovy et al.

Page 1 of 3

It is certified that error appears in the above-identified patent and that said Letters Patent is hereby corrected as shown below:

Delete the title page and substitute the attached title page therefor.

On the Title page, in field (75) in "Inventors", delete "Ovchinnikov Andrel" and insert -- Andrei Ovchinnikov --, therefor.

On the Title page, in field (75) in "Inventors", delete "Krouk Evguenii" and insert -- Evguenii Krouk --, therefor.

On the Title page, in field (57), in column 2, in "Abstract", line 5-6, delete "my means" and insert -- by means --, therefor.

On the Title page, in field (57), in column 2, in "Abstract", line 7, delete "my means" and insert -- by means --, therefor.

On sheet 5 of 6, in Figure 6, in Box 620, line 1, delete "wiht" and insert -- with --, therefor. (As per attached sheet)

Signed and Sealed this
Nineteenth Day of February, 2013

Teresa Stanek Rea
*Acting Director of the United States Patent and Trademark Office*

(12) United States Patent
Belogolovy et al.

(10) Patent No.: US 8,230,296 B2
(45) Date of Patent: Jul. 24, 2012

(54) ITERATIVE DECODING OF CONCATENATED LOW-DENSITY PARITY-CHECK CODES

(75) Inventors: Andrey Belogolovy, Saint-Petersburg (RU); Ovchinnikov Andrei, Saint-Petersburg (RU); Krouk Evguenii, Saint-Petersburg (RU)

(73) Assignee: Intel Corporation, Santa Clara, CA (US)

( * ) Notice: Subject to any disclaimer, the term of this patent is extended or adjusted under 35 U.S.C. 154(b) by 766 days.

(21) Appl. No.: 12/162,655

(22) PCT Filed: Jan. 31, 2006

(86) PCT No.: PCT/RU2006/000032
§ 371 (c)(1),
(2), (4) Date: Jan. 21, 2009

(87) PCT Pub. No.: WO2007/089165
PCT Pub. Date: Aug. 9, 2007

(65) Prior Publication Data
US 2009/0249163 A1  Oct. 1, 2009

(51) Int. Cl.
H03M 13/00 (2006.01)
(52) U.S. Cl. ........ 714/755; 714/752; 714/758; 714/800; 714/801
(58) Field of Classification Search ............... 714/752, 714/755, 758, 780, 800, 801
See application file for complete search history.

(56) References Cited

U.S. PATENT DOCUMENTS

| 2003/0043487 A1* | 3/2003 | Morita et al. ............ 360/25 |
| 2004/0123229 A1 | 6/2004 | Kim et al. |
| 2005/0149842 A1* | 7/2005 | Kyung et al. ............ 714/800 |
| 2005/0160351 A1* | 7/2005 | Ko et al. ............ 714/801 |
| 2006/0107176 A1* | 5/2006 | Song ............ 714/758 |
| 2007/0234184 A1* | 10/2007 | Richardson ............ 714/780 |

FOREIGN PATENT DOCUMENTS

WO   2007089165 A1   8/2007

OTHER PUBLICATIONS

First Office Action Mailed Oct. 8, 2010, Chinese Patent Application No. 200680052162.3.

Behairy, H., et al, "On the Design, Simulation and Analysis of Parallel Concatenated Gallager Codes", Proc. of 2002 IEEE International Conference on communications, vol. 1 of 5, Apr. 28, 2002, pp. 1850-1854.

Futaki, H., et al, "Low-density parity-check (LDPC) coded MIMO systems with iterative turbo decoding", Proc. Of Vehicular Technology Conference 2003, Oct. 6, 2003, pp. 342-346.

Jin, L., et al, "Low complexity decoding algorithm of parallel concatenated LDPC code", Proc. Of IEEE 6th Circuits and System Symposium, May 31, 2004, pp. 289-291.

Lee, H. S., et al, "Serially Concatenated LDPC and Turbo Code with Global Iteration", Proc. Intern. Conference on Systems Engineering 2005, Aug. 16, 2005, pp. 201-204.

* cited by examiner

*Primary Examiner* — Sam Rizk
(74) *Attorney, Agent, or Firm* — Kacvinsky Daisak, PLLC

(57) ABSTRACT

Techniques to perform iterative decoding of concatenated low-density parity-check codes (LDPC) are described. Iterative decoding of the concatenated code is achieved by performing T common iterations, wherein a common iteration comprises t1 decoding iterations on the inner LDPC code my means of a first decoder (340) followed by t2 decoding iterations on the outer LDPC code my means of a second decoder (350), and wherein the two decoders exchange soft-output information.

20 Claims, 6 Drawing Sheets